United States Patent
Nagai

(10) Patent No.: US 10,958,808 B2
(45) Date of Patent: Mar. 23, 2021

(54) IMAGE FORMING APPARATUS CONTROLLING COLOR REPRODUCTION RANGE AND TONE REPRODUCIBILITY

(71) Applicant: CANON KABUSHIKI KAISHA, Tokyo (JP)

(72) Inventor: Jun Nagai, Abiko (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/530,652

(22) Filed: Aug. 2, 2019

(65) Prior Publication Data
US 2020/0052712 A1 Feb. 13, 2020

(30) Foreign Application Priority Data

Aug. 10, 2018 (JP) .............................. JP2018-151968

(51) Int. Cl.
*H04N 1/40* (2006.01)
*H04N 1/405* (2006.01)
*H03M 1/20* (2006.01)
*G03G 15/00* (2006.01)
G03G 15/08 (2006.01)
G03G 15/01 (2006.01)

(52) U.S. Cl.
CPC ......... *H04N 1/405* (2013.01); *G03G 15/5008* (2013.01); *H03M 1/201* (2013.01); *G03G 15/011* (2013.01); *G03G 15/0813* (2013.01); *G03G 15/5054* (2013.01)

(58) Field of Classification Search
None
See application file for complete search history.

(56) References Cited

U.S. PATENT DOCUMENTS

| 7,643,179 | B2 | 1/2010 | Yasutomi |
| 10,018,951 | B2 | 7/2018 | Saito et al. |
| 10,095,146 | B2 | 10/2018 | Yamada |
| 10,488,784 | B2 * | 11/2019 | Yamada ............. G03G 15/5041 |
| 2004/0051906 | A1 | 3/2004 | Engbrocks et al. |
| 2005/0219628 | A1 * | 10/2005 | Yasutomi ............. H04N 1/4058 358/3.16 |
| 2018/0088482 | A1 * | 3/2018 | Yamada ................... H04N 1/29 |
| 2018/0348659 | A1 | 12/2018 | Yamada |

FOREIGN PATENT DOCUMENTS

| JP | 09-174939 A | 7/1997 |
| JP | 2005-078030 A | 3/2005 |
| JP | 2005-192195 A | 7/2005 |
| JP | 2007-156394 A | 6/2007 |
| JP | 2010-268359 A | 11/2010 |
| JP | 2017-181964 A | 10/2017 |
| JP | 2018-054862 A | 4/2018 |

* cited by examiner

*Primary Examiner* — Barbara D Reinier
(74) *Attorney, Agent, or Firm* — Venable LLP

(57) ABSTRACT

An image forming includes a dither processing unit that applies a dither matrix to an image; an exposure unit that exposes a photosensitive drum to form an electrostatic latent image based on the image to which the dither matrix has been applied; a development unit that develops, using a developing material on a developing roller, the formed electrostatic latent image; and a control unit that, based on a print setting change instruction by a user, increases a circumferential speed of the developing roller relative to the circumferential speed of the photosensitive drum and decreases a screen ruling of the dither matrix to be applied by the dither processing unit.

8 Claims, 10 Drawing Sheets

FIG. 7
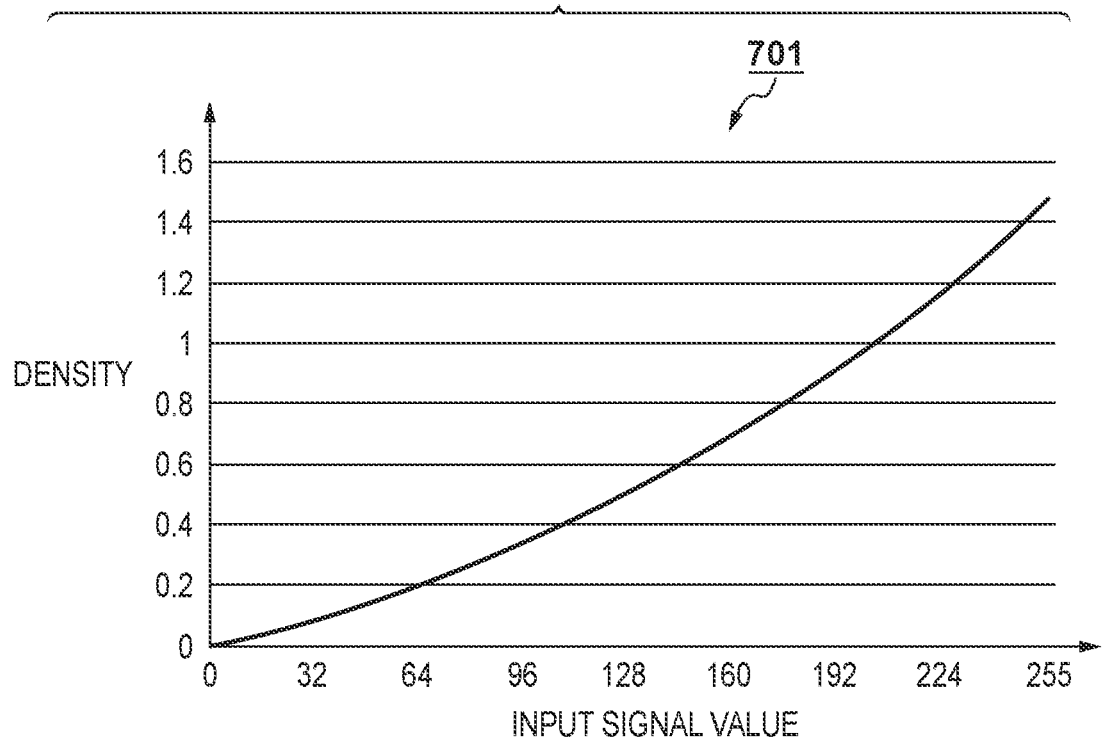
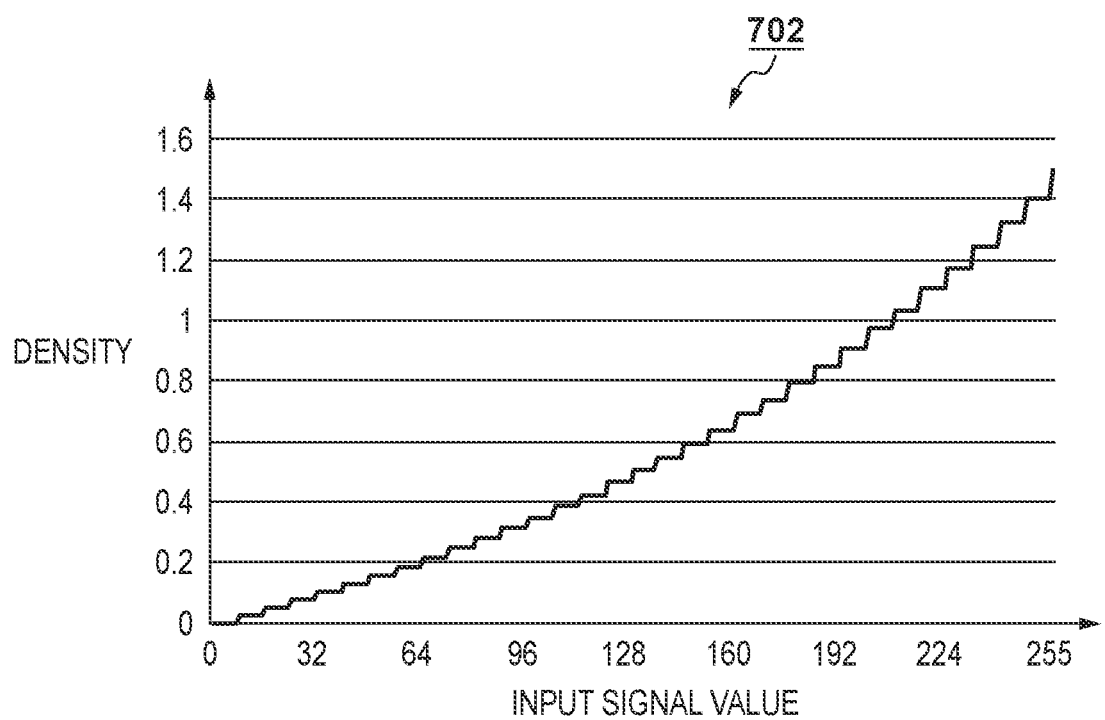

FIG. 8
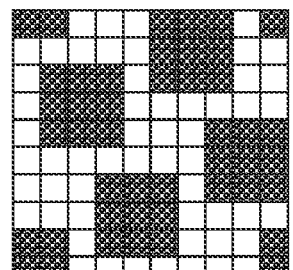
IMAGE DATA
801
→ PRINTING
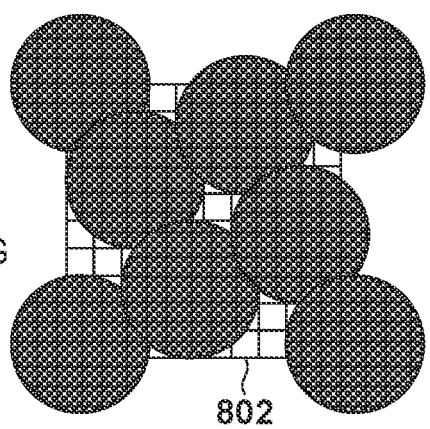
802
FIG. 9
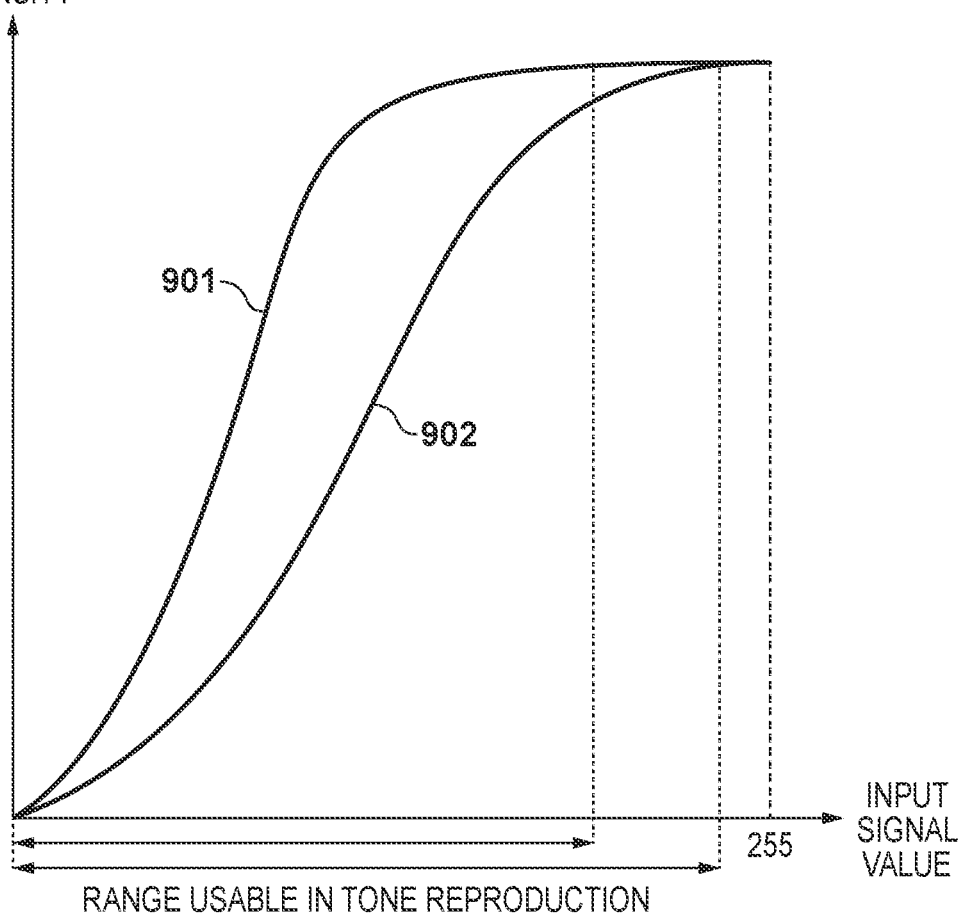

FIG. 11
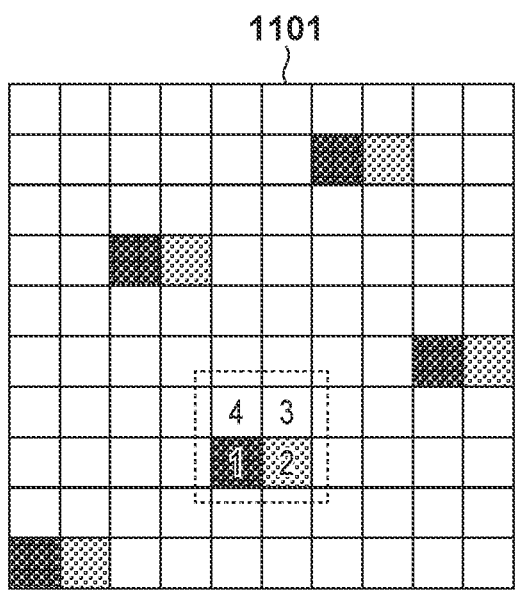
1101
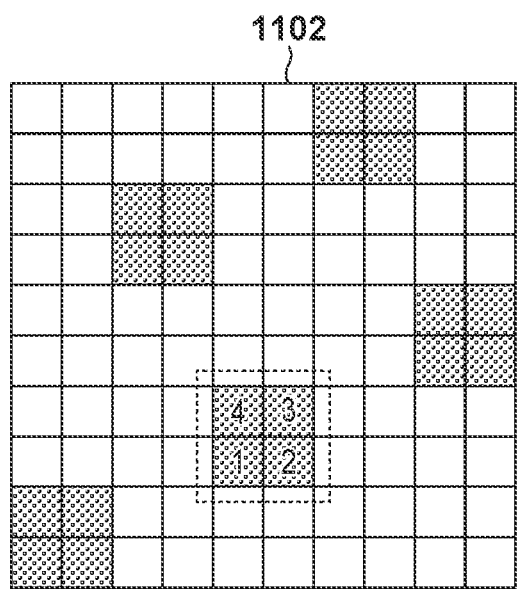
1102
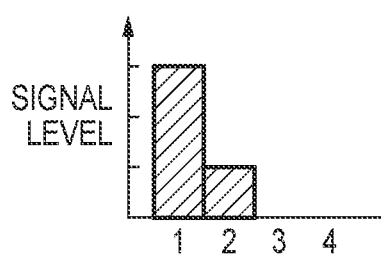
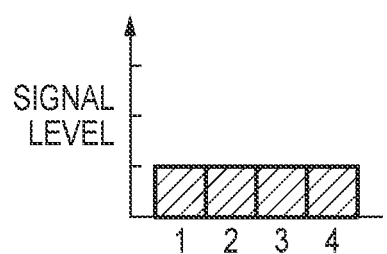

F I G. 12

IMAGE FORMING APPARATUS CONTROLLING COLOR REPRODUCTION RANGE AND TONE REPRODUCIBILITY

BACKGROUND OF THE INVENTION

Field of the Invention

The present invention relates to an image forming apparatus.

Description of the Related Art

In recent years, a color gamut has become important as one indicator of high image quality of an output image in an image forming apparatus that forms a color image on a recording medium by using an electrophotographic method. The color gamut represents a color reproduction range that can be reproduced by the image forming apparatus, and the wider the color gamut, the wider the color reproduction range. As a method for enlarging the color gamut, for example, there is a method in which an amount of developer used is larger than usual. Japanese Patent Laid-Open No. 2018-54862 discloses a technique for causing the rotational speeds of a photosensitive drum and a developing roller to vary and controlling a circumferential speed ratio to thereby change the amount of developer (hereinafter referred to as the toner amount) to be used, and enlarge a reproducible color gamut when outputting an image.

However, there is a problem in the foregoing conventional technique as is described below. For example, when the color gamut is widened by placing a large amount of toner on the recording medium by varying the circumferential speed ratio of the photosensitive drum and the developing roller as in the above-mentioned conventional technique, a phenomenon occurs in that the size of a pixel at the time of printing becomes larger than usual because a large amount of toner is used.

As a result, the density of an output image becomes high, and in particular, a phenomenon occurs in which a collapse occurs in an intermediate/high density portion and tone reproduction cannot be performed. Concerning the density characteristic of the output image, although it is possible to cope by executing a separate density correction at a time of processing for enlarging the color gamut, it is difficult to cope with the deterioration of the tone reproducibility in a range from highlights to an intermediate density region with a density correction, and as a result, an adverse effect such as a pseudo contour occurs. In order to cope with the density correction without lowering the tone correction, it takes time to generate a tone correction table, and an increase in the processing load becomes a problem.

SUMMARY OF THE INVENTION

The present invention enables realization of a mechanism for suitably performing a tone correction without impairing tone reproducibility when changing the amount of toner used at a time of image formation by controlling the rotational speeds of a photosensitive drum and a developing roller.

One aspect of the present invention provides an image forming apparatus, comprising: a dither processing unit that applies a dither matrix to an image; an exposure unit that exposes a photosensitive drum to form an electrostatic latent image, based on the image to which the dither matrix has been applied; a development unit that develops, using a developing material on a developing roller, the formed electrostatic latent image; and a control unit that, based on a print setting change instruction by a user, increases a circumferential speed of the developing roller relative to a circumferential speed of the photosensitive drum and decreases a screen ruling of the dither matrix to be applied by the dither processing unit.

Another aspect of the present invention provides an image forming apparatus, comprising: a dither processing unit that applies a dither matrix to an image; a forming unit that forms the image, to which the dither matrix has been applied, onto a sheet; and a control unit that, based on a print setting change instruction by a user, causes a maximum density to be formed in the forming unit to increase and decreases a screen ruling of the dither matrix applied by the dither processing unit.

Still another aspect of the present invention provides an image forming apparatus, comprising: a dither processing unit that applies a dither matrix to an image; a forming unit that forms the image, to which the dither matrix has been applied, onto a sheet; and a control unit that, based on a print setting change instruction by a user, causes a maximum density to be formed in the forming unit to increase and changes a threshold of the dither matrix to be applied by the dither processing unit.

Further features of the present invention will be apparent from the following description of exemplary embodiments with reference to the attached drawings.

BRIEF DESCRIPTION OF THE DRAWINGS

FIG. 7 is a view illustrating a relationship between a number of tone reproductions and density characteristics according to an embodiment.

FIG. 8 is a view illustrating a situation for when image data according to an embodiment is printed onto a sheet surface.

FIG. 9 is a view illustrating a relationship between a number of tone reproductions and density characteristics according to an embodiment.

FIG. 11 is a view illustrating features of a screen according to an embodiment.

FIG. 12 is a view for describing screens with different screen rulings, according to an embodiment.

DESCRIPTION OF THE EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

A multi-function peripheral (digital multi-function peripheral/MFP/Multi-Function Peripheral) will be described as an example of an image forming apparatus according to the embodiment. However, the present invention can be applied to an electrophotographic image forming apparatus such as a laser printer or a facsimile machine without departing from the spirit of the present invention.

First Embodiment

<Basic Configuration of Image Forming Apparatus (System)>

Figure 1:
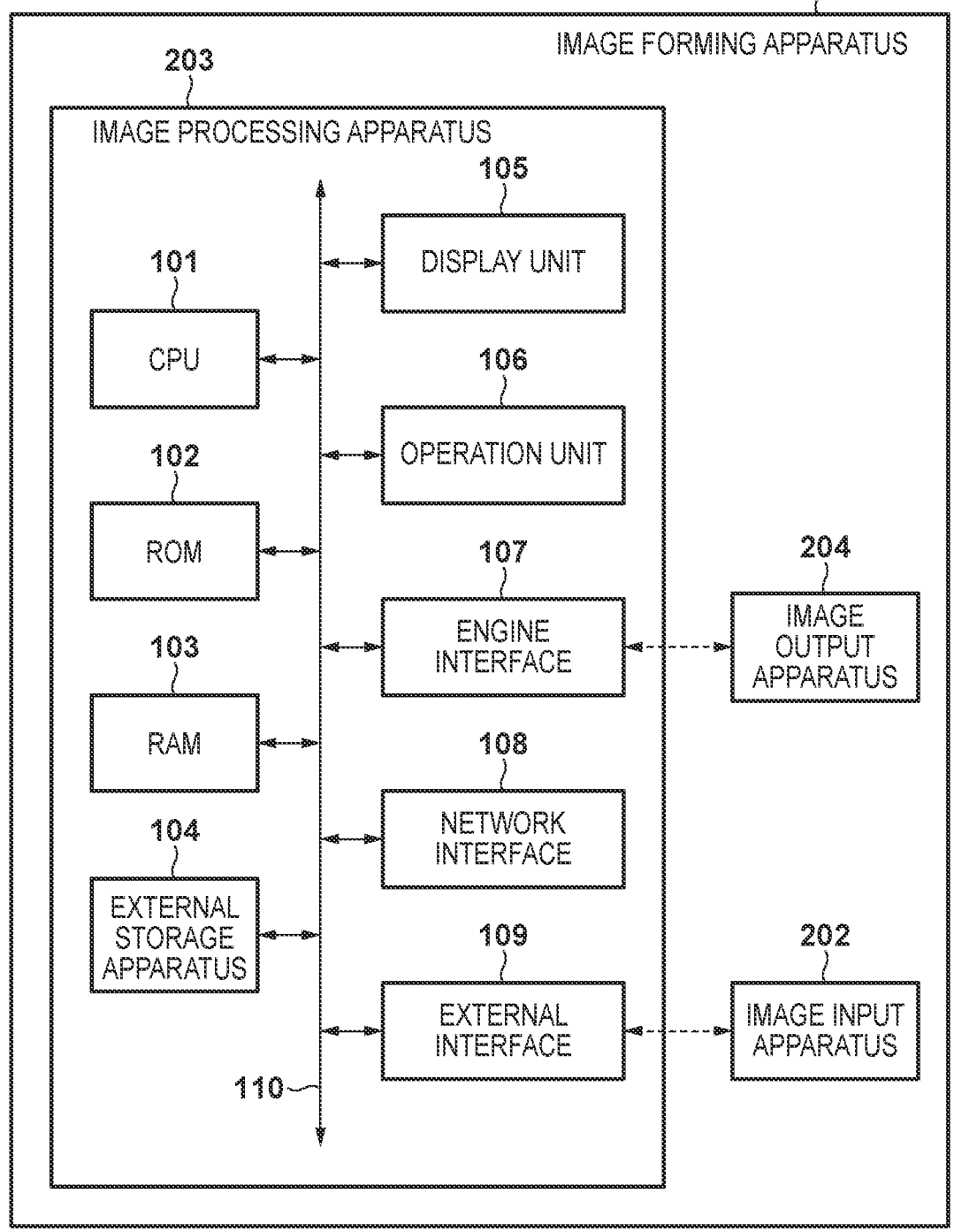
FIG. 1 is a schematic diagram of a system configuration of an image forming apparatus according to an embodiment.

Description is given below regarding a first embodiment of the present invention, with reference to the attached drawings. First, referring to FIG. 1, a basic configuration of an image forming apparatus in the present embodiment will be described. The image forming apparatus 100 includes an image input apparatus 202, an image processing apparatus 203, and an image output apparatus 204. The image processing apparatus 203 includes a CPU 101, a ROM 102, a RAM 103, an external storage apparatus 104, a display unit 105, an operation unit 106, an engine interface 107, a network interface 108, an external interface 109, and a system bus 110.

To describe the above configuration in detail, the CPU (Central Processing Unit) 101 is a central processing unit that controls the entire apparatus, performs arithmetic processing, and the like, and executes processing described later based on programs stored in the ROM 102. The ROM (Read Only Memory) 102 is a read-only memory. The ROM 102 is a storage region for data such as a system activation program and a program for controlling a printer engine 209, which will be described later. The RAM 103 is a random access memory. Programs and data are loaded into the RAM 103 for each of various processes, and the programs and data are executed by the CPU 101. The RAM 103 can also be used as a data storage region for received image data. The external storage apparatus 104 is configured by, for example, a hard disk or the like. The external storage apparatus 104 spools data, stores programs, various information files and image data, and is used as a region for work for the CPU 101.

The display unit 105 has, for example, a liquid crystal display device, and performs various display under the control of the CPU 101. The display unit 105 is used to display, for example, a setting state of the image forming apparatus 100, current processing in the apparatus, an error state, and the like. The operation unit 106 is used by the user to instruct the image forming apparatus 100 to change or reset a setting. The operation unit 106 provides a user interface together with the display unit 105. For example, the operation unit 106 can cause the display unit 105 to display an operation screen for specifying printing conditions such as a layout and an enlargement/reduction rotation, and setting a wide color gamut image forming mode, which will be described later, and accept a user input via the screen.

The engine interface 107 is an interface for inputting and outputting commands and the like for controlling the printer engine, which is the image output apparatus 204. The network interface 108 is an interface for connecting the image processing apparatus 203 to a network. For example, the image processing apparatus 203 receives image data and drawing commands from a host computer via the network and the network interface 108. The external interface 109 is connected to a scanner or a digital camera, which is an image input apparatus 202, via a parallel or serial interface, for example. The system bus 110 serves as a data path between the above-described components.

A sequence of processing illustrated in the flowchart described later is realized by being stored in any apparatus out of the ROM 102, the RAM 103, or the storage apparatus 104, for example, and executed by the CPU 101.

<Image Processing Apparatus Configuration>

Figure 2:
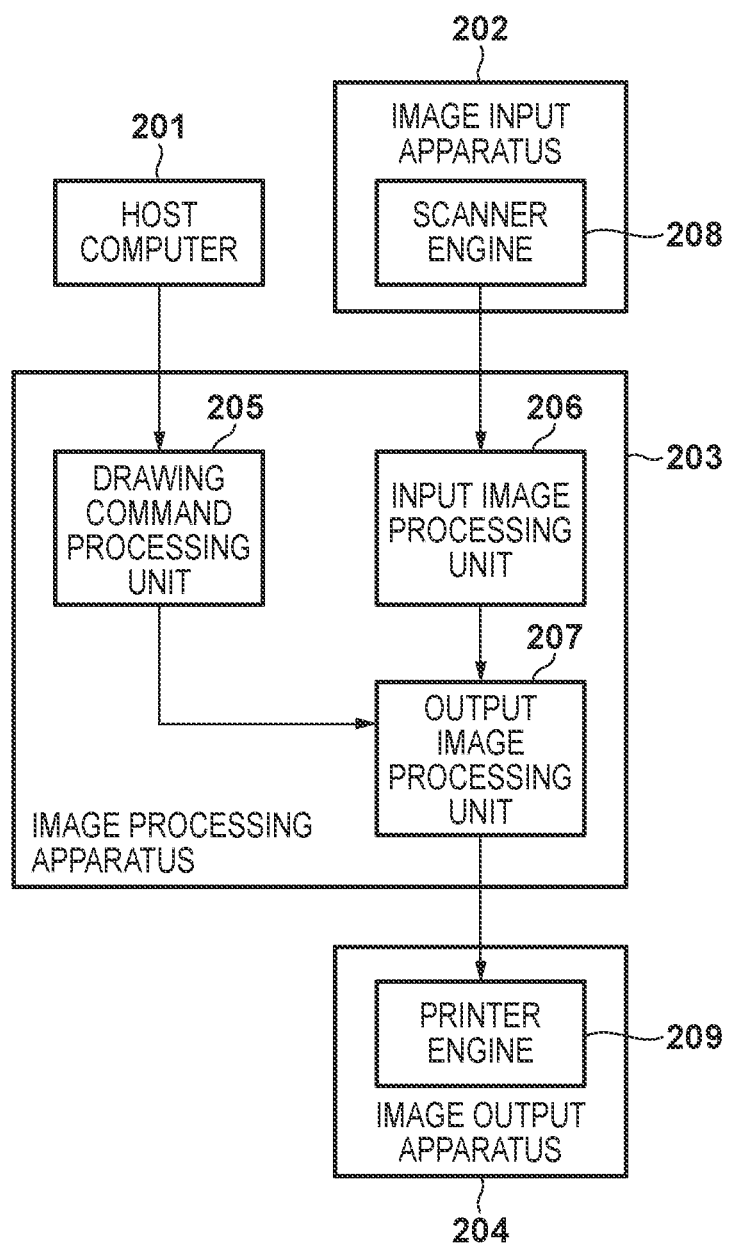
FIG. 2 is a block diagram illustrating a configuration of an image processing apparatus according to an embodiment.

Next, referring to FIG. 2, a configuration of an image processing apparatus according to the present embodiment will be described. The image forming apparatus 100 is an MFP that is configured by including the image input apparatus 202, the image processing apparatus 203, and the image output apparatus 204. Each functional unit of the image processing apparatus 203 may be implemented, for example, by the CPU 101 executing a predetermined program stored in the ROM 102. In addition, some or all of them may be realized by a hardware circuit such as ASIC (Application Specific Integrated Circuit). They may also be realized by an ASIP (Application Specific Instruction-set Processor), an ASSP (Application Specific Standard Produce), or the like.

(Print Processing in Accordance with Drawing Command from Host Computer)

Here, description will be given regarding a process in which the image forming apparatus 100 receives a drawing command transmitted from the host computer 201 in the image processing apparatus 203, and performs printing in accordance with the image output apparatus 204.

Applications that operates on the host computer 201 create a page layout document, a word processor document, a graphic document, or the like. Digital document data created by these applications is transmitted to a printer driver (not illustrated), and a drawing command based on the digital document is generated. The digital document data to be transmitted to the printer driver is not limited to something created by the host computer 201, and may be created by an application or a scanner of another computer and stored in the host computer 201.

Here, as a drawing command to be generated, a page description languages (PDL) for creating page image data is generally used. In addition to drawing instructions for data such as an image, a graphic, and text, a drawing command normally includes, as control instructions, print settings relating to a number of copies, a page layout, or the like. The drawing command generated by the printer driver is transmitted to the image processing apparatus 203 via the network. Based on the drawing command received from the host computer 201, the image processing apparatus 203 generates image data in an image format in which the image output apparatus 204 can form an image.

A control configuration of the image processing apparatus 203 will be described. The image processing apparatus 203 includes a drawing command processing unit 205, an input image processing unit 206, and an output image processing unit 207. The drawing command processing unit 205 performs analysis processing on the drawing command received from the host computer 201 via the network interface 108, generates a drawing object, and further performs rasterization processing to generate a bitmap image. The output image processing unit 207 performs image processing such as color conversion processing and halftone processing according to print settings on the generated bitmap image, and converts the bitmap image into image data of an image format that can be processed by the printer engine 209. A detailed description of the output image processing unit 207 in the present embodiment will be described later.

The image processing apparatus 203 transmits the generated image data to the image output apparatus 204 via the engine interface 107. The image output apparatus 204 is connected to the image processing apparatus 203 via the engine interface 107, and includes the printer engine 209. The printer engine 209 receives image data that was generated in a predetermined image format from the image processing apparatus 203, and prints the image data onto a fed transfer sheet surface. That is, the printing onto the sheet surface as the transfer material (a recording medium) is completed by performing exposure, development, transfer, and fixing processes. By the processing described above, the processing of printing the drawing command from the host computer 201 as an image is completed.

(Print Processing of Bitmap Image Input from Scanner)

Next, a process of printing a bitmap image input from the image input apparatus 202 will be described. The image input apparatus 202 includes a scanner engine 208. The scanner engine 208 is connected to the image processing apparatus 203 via the external interface 109. The scanner engine 208 optically scans an image that has been printed onto a sheet or film, measures the intensity of reflected light or transmitted light, and reads a bitmap image by an analog-digital conversion. The bitmap image acquired here is generally an RGB image.

The bitmap image read by the scanner engine 208 is supplied to the input image processing unit 206. The input image processing unit 206 performs image processing such as shading correction, inter-line correction, and color correction on the received bitmap image data, and passes the image data after the image processing to the output image processing unit 207. Thereafter, the output image processing unit 207 performs image processing on the received bitmap image, and converts the bitmap image into an image format that can be received by the printer engine 209. The image data thus generated is transferred to the printer engine 209, and an image is output onto a sheet surface (a recording medium) by the printer engine 209. By the processing described above, a process of printing a bitmap image input from the image input apparatus 202 such as the scanner engine 208 completes.

In some cases, the host computer 201 receives not a drawing command but a bitmap or JPEG compressed image data. In this case, the image data received from the host computer 201 is input to the input image processing unit 206.

<Printer Engine>

Figure 3:
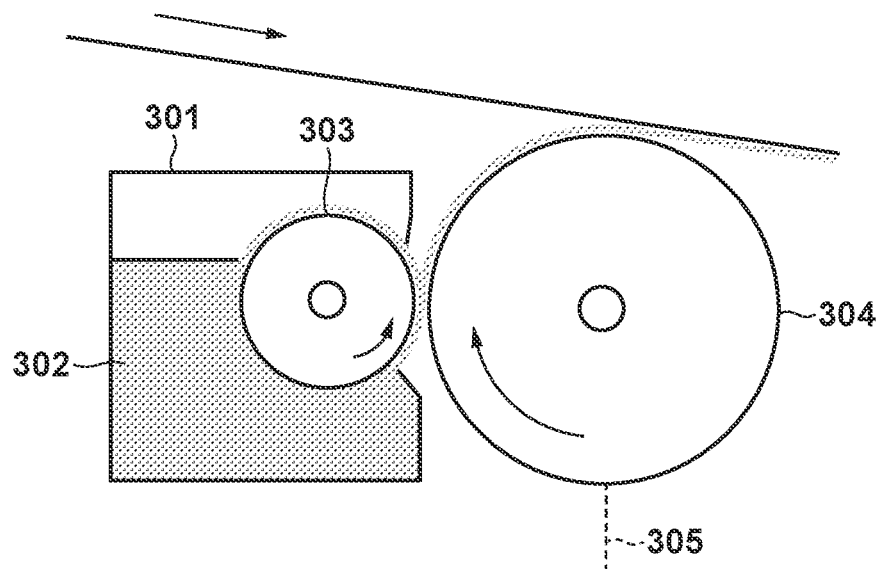
FIG. 3 is a view illustrating a part of a configuration of a printer engine according to an embodiment.

Next, the configuration of a part of the printer engine 209 according to the present embodiment will be described with reference to FIG. 3. The printer engine 209 includes a developing device 301 and a photosensitive drum 304. A laser 305 irradiates the photosensitive drum 304 to form an electrostatic latent image on the photosensitive drum 304. The developing device 301 causes toner 302 to adhere to the developing roller 303 in a thin film form to develop the electrostatic latent image formed on the photosensitive drum 304, and the image from the photosensitive drum 304 is transferred onto a recording sheet to perform recording. The CPU 101 accepts a setting by a user from the operation unit 106, and controls the rotational speeds of the developing roller 303 and/or the photosensitive drum 304 in accordance with the setting. In a typical multicolor printer using CMYK toner 302, four combinations of the developing device 301 and the photosensitive drum 304 are provided.

As image forming operations, the image forming apparatus 100 according to the present embodiment has two image forming modes: a normal image forming mode for reproducing a normal color gamut image and a wide color gamut image forming mode for reproducing a wide color gamut image. In the wide color gamut image forming mode, the circumferential speed ratio of the photosensitive drum 304 as an image carrier and the developing roller 303 as a developer carrier, that is, the ratio of the rotational speed (a circumferential speed) of the developing roller 303 to the rotational speed of the photosensitive drum 304 is changed in contrast to that in the normal image forming mode.

More specifically, in the wide color gamut image forming mode, there is an attempt to expand the color gamut by moving more toner 302 from the developing roller 303 to the photosensitive drum 304. Here, the rotational speed of the developing roller 303 is fixed regardless of mode, and the rotational speed of the photosensitive drum 304 is controlled. That is, when the rotational speed of the photosensitive drum 304 is slowed to increase the circumferential speed ratio of the developing roller 303 with respect to the photosensitive drum 304, more toner 302 is supplied from the developing roller 303 to the photosensitive drum 304. As a result, the amount of toner applied per unit area on the recording medium increases, and the color gamut is enlarged by increasing the density of the image formed on the recording medium. Therefore, in the wide color gamut image forming mode, the rotational speed of the photosensitive drum 304 is reduced, and the circumferential speed ratio of the developing roller 303 with respect to the photosensitive drum 304 is increased.

<Output Image Processing Unit>

Figure 4:
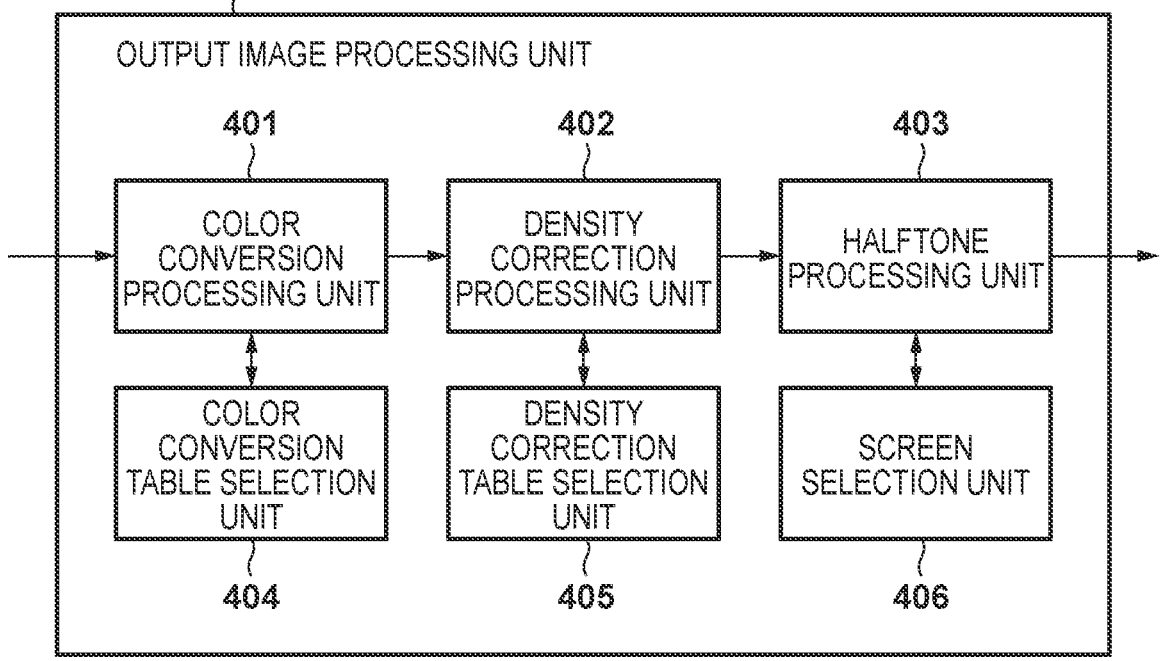
FIG. 4 is a block diagram illustrating a configuration of an output image processing unit according to an embodiment.

Next, referring to FIG. 4, a configuration of the output image processing unit 207 according to the present embodiment will be described. The output image processing unit 207 includes a color conversion processing unit 401, a density correction processing unit 402, a halftone processing unit 403, a color conversion table selection unit 404, a density correction table selection unit 405, and a screen selection unit 406. Note that, in the present embodiment, a case where the output image processing unit 207 is implemented as a hardware circuit such as an ASIC (Application Specific Integrated Circuit) is envisioned. However, the present invention is not limited to this. It may be realized by a general-purpose processor executing a program corresponding to each function of the output image processing unit 207. Also, it may be realized by a general-purpose processor and a hardware circuit cooperating with each other.

The color conversion processing unit 401 converts inputted image data into data suitable for the printer engine 209, using a color conversion table selected by the color conversion table selection unit 404. For example, when inputted image data is RGB data and the image output apparatus 204 is a typical multicolor printer that uses CMYK toner 302, the color conversion processing unit 401 performs, on the input image data, a process of converting the RGB data into CMYK data. The color conversion table selection unit 404 selects a different color conversion table for each image forming mode having a different circumferential speed ratio for the photosensitive drum 304 and the developing roller 303. This is because, in the wide color gamut image forming mode, the reproducible color gamut is wide, and therefore, a color conversion table corresponding thereto is used.

The density correction processing unit 402, using the density correction table selected by the density correction table selection unit 405, performs density correction processing on the data that was converted into CMYK data by the color conversion processing unit 401. Here, the density correction table selection unit 405 selects a different density correction table for each image forming mode having a different circumferential speed ratio for the photosensitive drum 304 and the developing roller 303. This is because, in the wide color gamut image forming mode, output density values are different even if the same input signal value is provided, and therefore a density correction table in alignment with this is used.

The halftone processing unit 403, using the screen selected by the screen selection unit 406, performs halftone processing on the CMYK data whose densities have been corrected by the density correction processing unit 402. It is often the case that the printer engine 209 usually supports output of only a low number of tones such as 2, 4, or 16 tones. Therefore, the halftone processing unit 403 performs halftone processing on the CMYK image data so that it can be output with a stable halftone representation even with output by a small number of tones. Here, the screen selection unit 406 selects a different screen for each image forming mode having a different circumferential speed ratio for the photosensitive drum 304 and the developing roller 303. As described above, according to the present embodiment, each table or screen is prepared in advance for each image forming mode in each image processing unit, and is selected and used in accordance with the image forming mode. As a result, the processing load can be reduced.

<Screen Processing>

Figure 5:
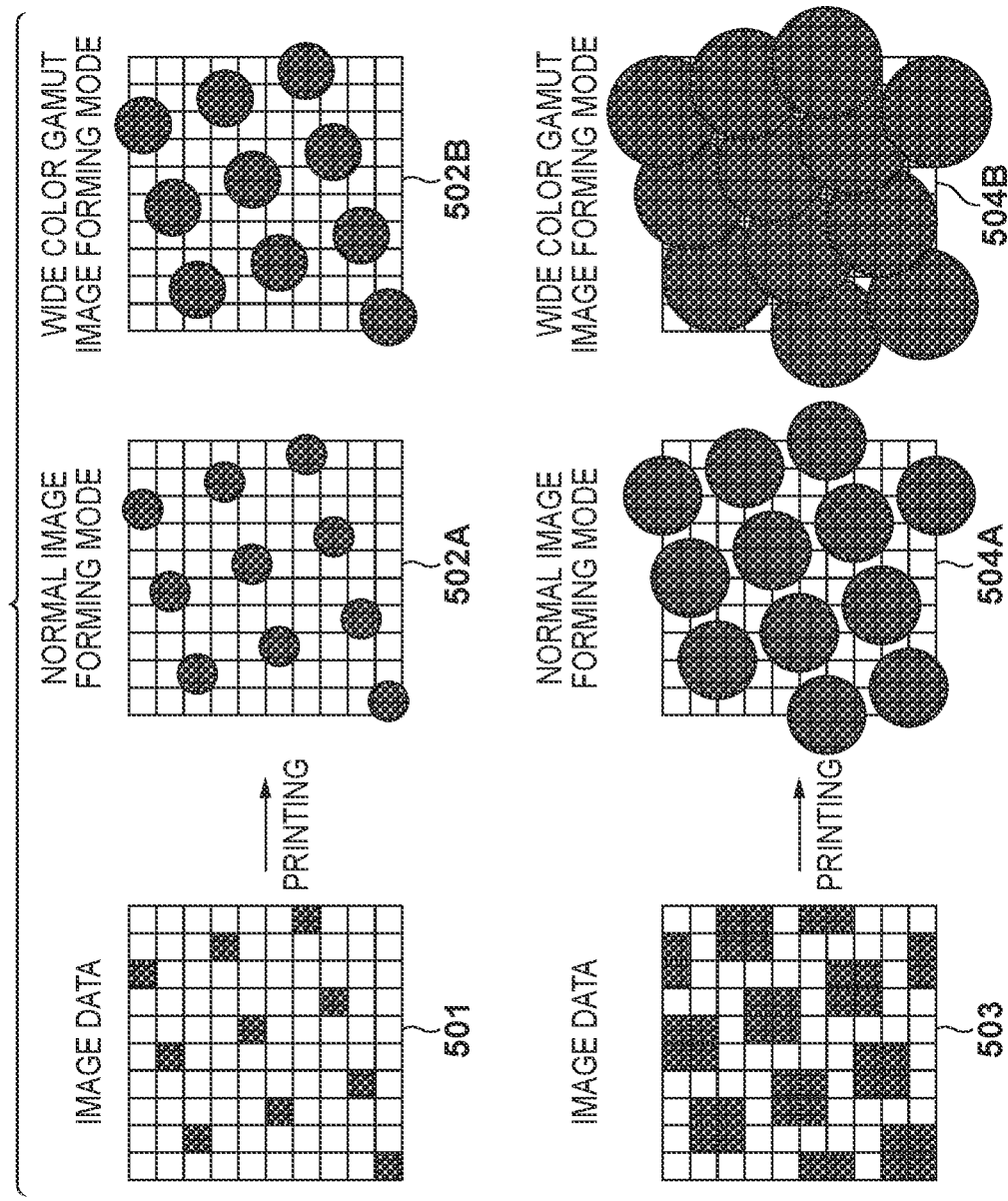
FIG. 5 is a view illustrating a situation for when image data according to an embodiment is printed onto a sheet surface.

Next, with reference to FIG. 5, description will be given regarding details of the screen processing selected by the screen selection unit 406 according to the present embodiment. FIG. 5 illustrates a schematic diagram of printing image data onto a sheet surface in a normal image forming mode and a wide color gamut image forming mode.

Reference numeral 501 indicates image data received by the printer engine 209, one square corresponds to image data of one pixel, and a black-filled square indicates a pixel to be printed. Reference numerals 502A and 502B indicate situations in which the image data 501 is printed onto a sheet surface in the normal image forming mode and the wide color gamut image forming mode, respectively. It is understood that the size per pixel is larger in 502B, which illustrates a situation of printing in the wide color gamut image forming mode, than in 502A, which illustrates a situation of printing in the normal image forming mode. This is because more toner is used in the wide color gamut image forming mode, so that toner spreads in the process of transfer and fixing, and the dot size increases.

Reference numeral 503 indicates image data that is for printing more pixels and in which inputted signal values are larger than those of the image data 501. Reference numerals 504A and 504B indicate situations in which the image data 503 is printed onto a sheet surface in the normal image forming mode and the wide color gamut image forming mode, respectively. Similar to what is indicated by reference numerals 502A and 502B, the toner spreads and the dot size increases with reference numeral 504B, which indicates a situation of printing in the wide color gamut image forming mode, as compared with reference numeral 504A, which indicates a situation of printing in the normal image forming mode. As a result, the printed portion becomes large. Here, in 504A, blank background portions of the sheet on which toner is not yet placed remain, whereas in 504B, blank background portions of the sheet are almost filled by the toner 302, so that blank background portions of the sheet are not visible. This means that, for the image data indicated by reference numeral 503, the blank background portions of the sheet do not change even if the number of pixels to be printed is increased, which indicates that the density does not substantially change. That is, even if the input signal value increases, the density does not change.

<Density Characteristics After Halftone Processing>

Figure 6:
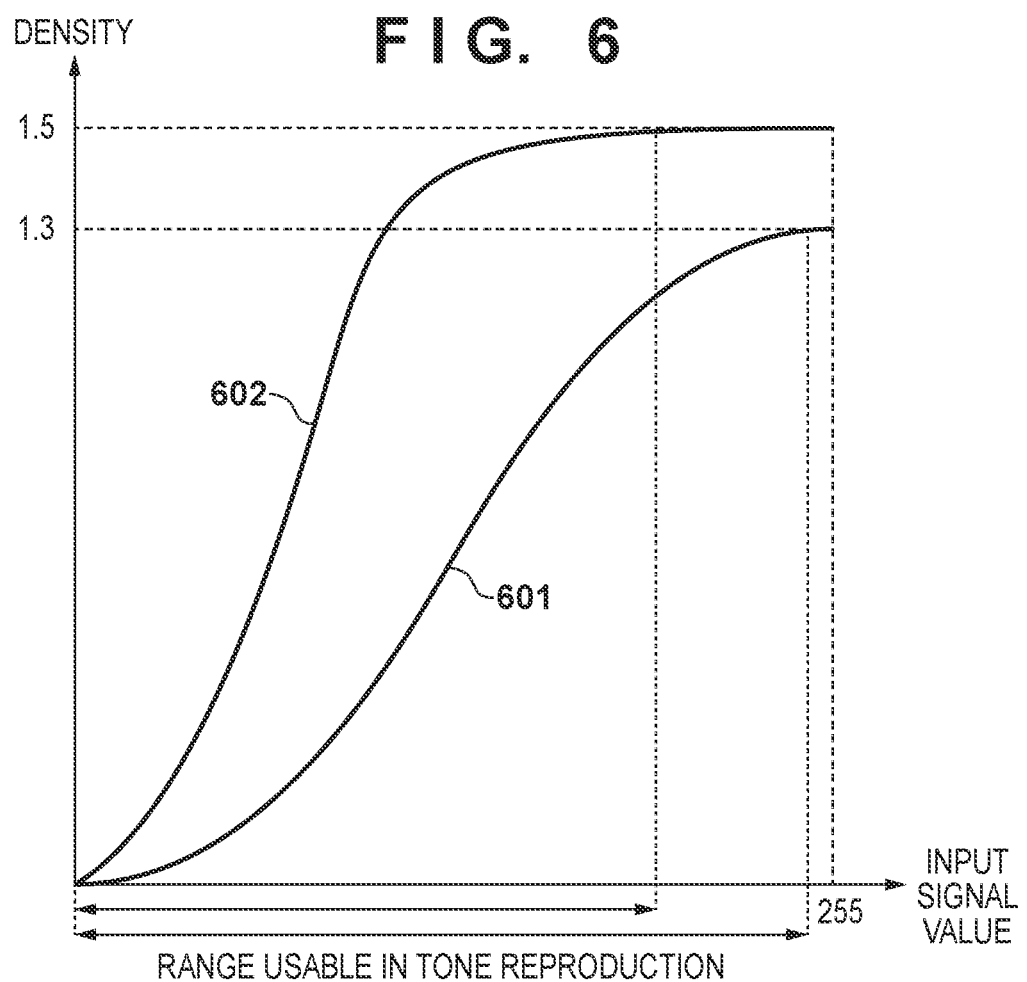
FIG. 6 is a view that illustrates density characteristics for an input signal according to an embodiment.

Next, with reference to FIG. 6, description is given for a density characteristic that is printed for an input signal when halftone processing is performed using a predetermined screen according to the present embodiment. The density characteristic illustrated in FIG. 6 is for a state in which the density correction by the density correction processing unit 402 has not been performed.

Reference numeral 601 denotes a density characteristic when printing is performed in the normal image forming mode, and reference numeral 602 denotes a density characteristic when printing is performed in the wide color gamut image forming mode. In contrast to the density characteristic 601 for when printing is performed in the normal image forming mode, with the density characteristic 602 for when printing is performed in the wide color gamut image forming mode, the output density value at the maximum input signal value (255) has increased from D 1.3 to D 1.5. As a result, the color reproduction range is widened in the wide color gamut image forming mode. On the other hand, as described above, for the density characteristic 602 for when printing is performed in the wide color gamut image forming mode, there is, from a certain input signal value, a region in which the density value does not increase even if the signal value increases. Therefore, compared with the case of printing in the normal image forming mode, the range usable for tone reproduction becomes narrower and the number of tone reproductions becomes smaller in the case of printing in the wide color gamut image forming mode. Adverse effects caused by the small number of tone reproductions will be described with reference to FIG. 7.

Reference numeral 701 indicates a density characteristic with respect to an input signal that is a result of the density correction processing performed by the density correction processing unit 402 when the number of tone reproductions is sufficient. As can be seen from the view, when the number of tone reproductions is sufficient, it is possible to smoothly correct the density characteristic to be a certain target.

In contrast, reference numeral 702 indicates a density characteristic with respect to an input signal that is a result of the density correction processing performed by the density correction processing unit 402 when the number of tone reproductions is not sufficient. Although correction is performed to a certain target density characteristic, the number of tone reproductions is insufficient, so that a smooth characteristic is not obtained. As a result, an adverse effect such as a pseudo contour occurs in the reproduction of an image.

In the present embodiment, to cope with the adverse effect that the number of tone reproductions is small as described above, the screen ruling used in the wide color gamut image forming mode is set to a lower screen ruling. The effect on the adverse effect occurring in the wide color gamut image forming mode of setting the screen ruling of the screen to a lower screen ruling will be described with reference to FIG. 8.

Reference numeral 801 denotes image data obtained by performing halftone processing using a screen with a lower screen ruling, as compared with the image data indicated by reference numeral 503. The printing rate of both 503 and 801 is about 40%, and the input signal value is substantially unchanged. Reference numeral 802 indicates a situation for a case of printing the image data 801 onto a sheet surface in the wide color gamut image forming mode. Here, when comparing 504B with 802, it can be seen that more blank background portions of the sheet are remaining for 802. This is because, when a screen having a low screen ruling is applied, the distances between the centers in the screen mesh is larger than in a case of applying a screen having a high screen ruling, and as a result, dots do not easily overlap each other even in a wide color gamut image forming mode in which the dot size becomes large.

FIG. 9 illustrates printed density characteristics for an input signal for when halftone processing is performed using screens with different screen rulings in the wide color gamut image forming mode. Note that the relationship between the input signal and the density characteristic in this figure is such that the density correction by the density correction processing unit 402 is not performed.

Reference numeral 901 denotes a density characteristic for when halftone processing is performed using a screen having a higher screen ruling. Reference numeral 902 denotes a density characteristic for when halftone processing is performed using a screen having a lower screen ruling. Even in the case where the dot size printed in the wide color gamut image forming mode is large, because a screen having a lower screen ruling is less likely to be crammed, it can be understood that the number of tone reproductions is secured.

<Sequence of Processing>

Figure 10:
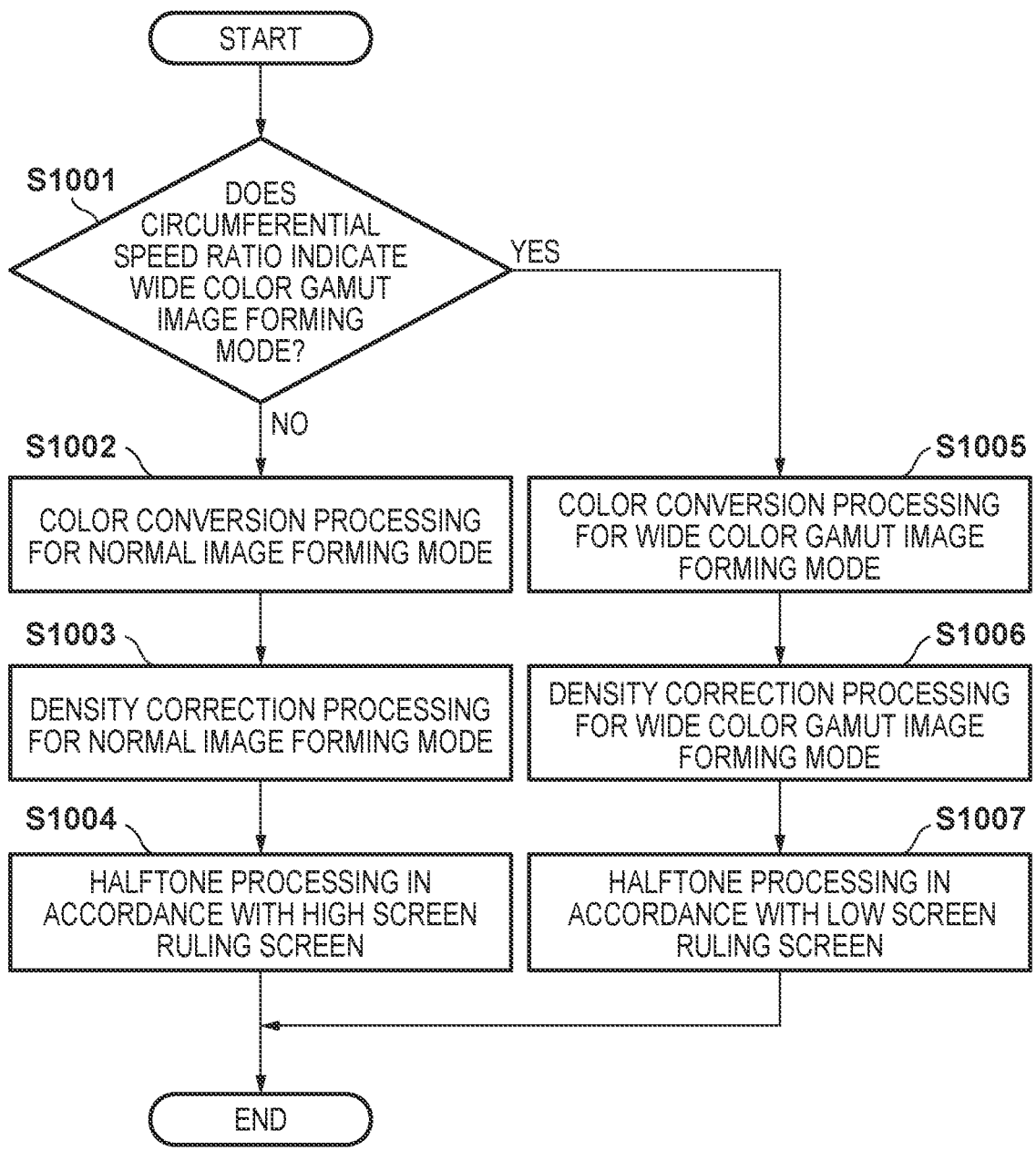
FIG. 10 is a flowchart of processing in the output image processing unit according to an embodiment.

Next, referring to FIG. 10, a flowchart of the processing of the output image processing unit 207 is illustrated. The processing described below is realized by, for example, the CPU 101 executing control programs stored in any apparatus out of the ROM 102, the RAM 103, and the storage apparatus 104.

Firstly, in step S1001, the CPU 101 determines whether the image forming mode is the normal image forming mode or the wide color gamut image forming mode. Specifically, the CPU 101 makes a determination by referring to a setting of the image forming mode for a time of printing or by referring to the circumferential speed ratio of the photosensitive drum 304 and the developing roller 303.

If it is determined that the image forming mode is the normal image forming mode, the processing proceeds to step S1002, where the color conversion table selection unit 404 selects a color conversion table for the normal image forming mode, and the color conversion processing unit 401 executes color conversion processing using the selected color conversion table. Subsequently, in step S1003, the density correction table selection unit 405 selects a density correction table for the normal image forming mode, and the density correction processing unit 402 executes density correction processing using the selected density correction table. Further, in step S1004, the screen selection unit 406 selects a screen to be used in the normal image forming mode. Here, in the present embodiment, a screen used in the wide color gamut image forming mode is a screen with a lower screen ruling as compared with a screen used in the normal image forming mode. Therefore, by comparing them, screens having a higher screen ruling and screens having a lower screen ruling are referred to as high screen ruling screens and low screen ruling screens, respectively. In step S1004, the screen selection unit 406 selects a high screen ruling screen, and the halftone processing unit 403 executes halftone processing using the selected screen.

In contrast, if it is determined in step S1001 that the image forming mode is the wide color gamut image forming mode, the processing proceeds to step S1005, where the color conversion table selection unit 404 selects a color conversion table for the wide color gamut image forming mode, and the color conversion processing unit 401 executes color conversion processing using the selected color conversion table. Subsequently, in step S1006, the density correction table selection unit 405 selects a density correction table for the wide color gamut image forming mode, and the density correction processing unit 402 executes density correction processing using the selected density correction table. Further, in step S1007, the screen selection unit 406 selects a low screen ruling screen, and the halftone processing unit 403 executes halftone processing using the selected screen.

<Screens>

Figure 12:
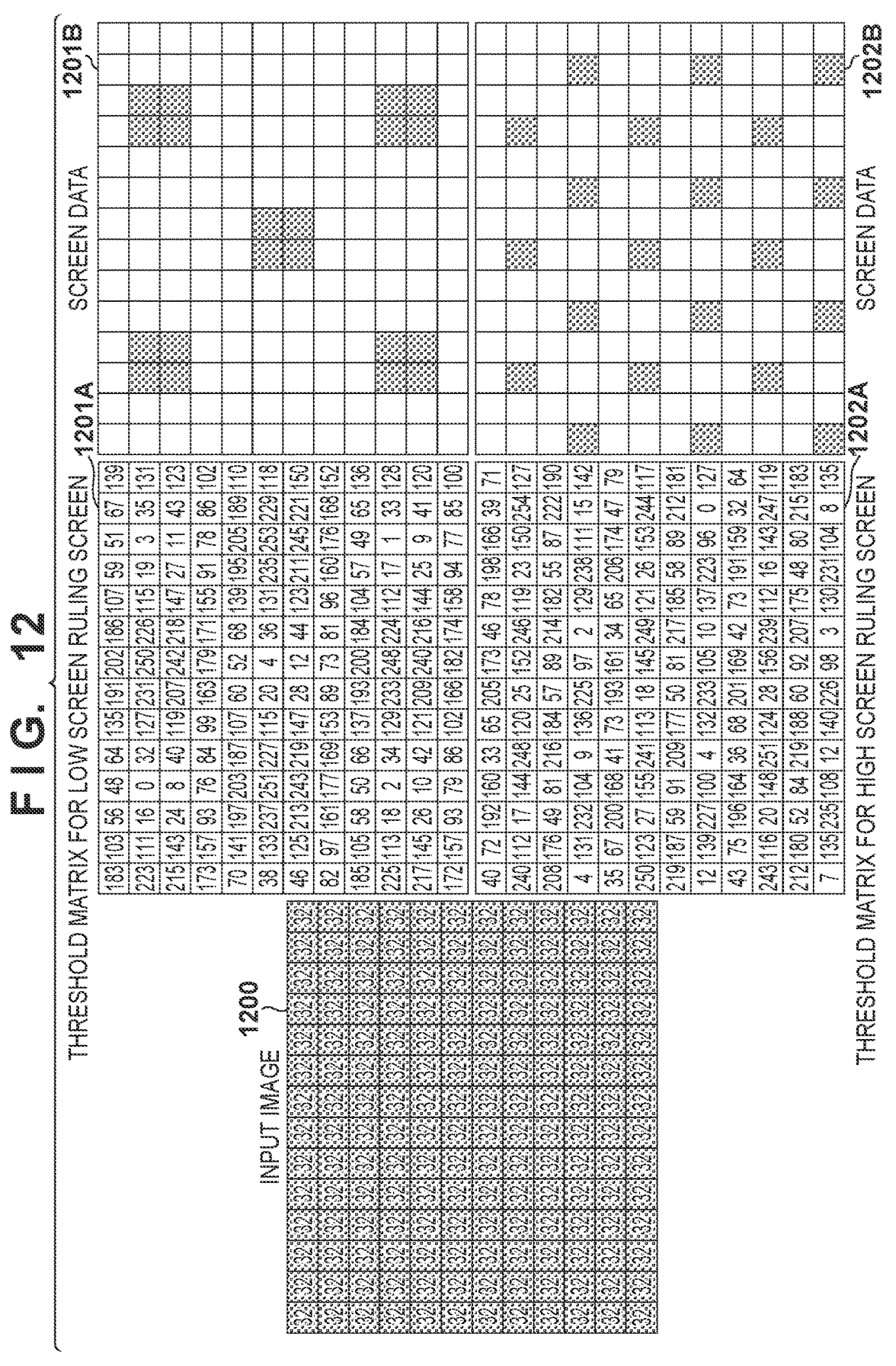

Here, referring to FIG. 12, a high screen ruling screen and a low screen ruling screen used in the screen processing according to the present embodiment will be described. Reference numeral 1200 indicates an input image to which halftone processing is applied. The image data is 8-bit image data and has all pixel signal values as "32".

Reference numeral 1201A indicates a threshold matrix (a dither matrix) for a low screen ruling screen applied in the halftone processing unit 403 when a low screen ruling screen is selected in the screen selection unit 406. The threshold matrix for this low screen ruling screen is compared with an input image, and dots are formed only for those pixels having a signal greater than a threshold value (dither processing). In this case, the screen data to be output is indicated by 1201B.

In contrast, reference numeral 1202A indicates a threshold matrix for a high screen ruling screen applied in the halftone processing unit 403 when a high screen ruling screen is selected in the screen selection unit 406. The threshold matrix for this high screen ruling screen is compared with an input image, and dots are formed only for those pixels having a signal greater than a threshold value. In this case, the screen data to be output is indicated by 1202B. As is clear from the view, even if halftone processing is applied to the same input image, the spacing between dots can be changed because the arrangement of the threshold matrices differs. In such a case, by widening the dot interval, a screen with a low screen ruling can be realized.

It is known empirically that when a low screen ruling screen is used, CMYK inter-color moire is likely to occur depending on combinations of screen patterns. Therefore, when a screen is selected in the wide color gamut image forming mode, the low screen ruling screen does not need to be selected for a color which is relatively inconspicuous even if the tone reproducibility is lowered as with yellow, for example. Thus, there are cases in which inter-color moire can be avoided. When the object is to widen the color reproduction range, the wide color gamut image forming mode does not need to be applied in relation to black in some cases. This is because, in a case of desiring to expand the color reproduction range in the saturation direction, the color toners of C, M, and Y mainly contribute, and black does not contribute. In this case, a low screen ruling screen does not need to select for black. The present invention also prevents a collapse by separating the centers of in the screen mesh from each other. Therefore, even in a screen having a relatively high screen ruling, a similar effect will arise by increasing a submatrix.

As described above, the image forming apparatus according to the present embodiment is provided with an image carrier (a photosensitive drum) on which an electrostatic latent image is formed, and a developer carrier (a developing roller) that carries developer (toner) for developing the electrostatic latent image formed on the image carrier. Further, the present image forming apparatus stores in advance, in a memory or the like, screens for executing halftone processing on inputted image data, the screens differing depending on an image forming mode. The present image forming apparatus selects a stored screen in accordance with an image forming mode, and executes halftone processing on inputted image data using the selected screen. Further, the present image forming apparatus controls the circumferential speed ratio between the rotational speed of the image carrier and the rotational speed of the developer carrier in accordance with the image forming mode, and performs image formation using image data that has been subject to image processing. In this manner, the present image forming apparatus executes processing to change the amount of toner used at a time of image formation and enlarge a color reproduction range by controlling the rotational speeds of the photosensitive drum 304 and the developing roller 303. At this time, by using a screen with a lower screen ruling for halftone processing, it is possible to have printing in which the color reproduction range is enlarged without impairing tone reproducibility.

Second Embodiment

Description is given below regarding a second embodiment of the present invention. In the first embodiment described above, the circumferential speed ratio of the photosensitive drum 304 and the developing roller 303 is controlled in accordance with the image forming mode, and the color gamut is enlarged by using a larger amount of toner in image forming. In this case, in order to avoid the deterioration of the tone reproducibility due to the collapse of a medium/high density portion, halftone processing is performed using a low screen ruling screen in order to cope with the adverse effect that the dot gain becomes large.

However, an example of an adverse effect of increasing the dot gain, is the occurrence of a phenomenon where the tone reproducibility in the low density portion is lowered and the texture of the screen becomes conspicuous. In the present embodiment, in addition to the configuration of the first embodiment described above, or instead of the configuration of the first embodiment described above, a mechanism for enabling printing without impairing the tone reproducibility even against such an adverse effect in the low density portion will be described.

Firstly, a description will be given of the adverse effect in the low density portion caused by an increase in the dot gain. The foregoing reference numeral 501 indicates image data in a low density portion, and a schematic diagram of printing this image data in the wide color gamut image forming mode is 502B. As illustrated, since each dot is printed larger, an adverse effect will occur in that a tone jump in the low density portion and the texture of the screen will be conspicuous. Therefore, a screen used in the wide color gamut image forming mode is caused to have a characteristic as below in addition to simply a low screen ruling as indicated in the first embodiment described above.

<Screens>

Referring to FIG. 11, a low density portion of a screen used in the wide color gamut image forming mode will be described. The screen described here assumes a screen for converting an input image into an output image of four tones as a result of halftone processing.

Reference numerals 1101 and 1102 indicate signal levels of image data resulting from pseudo-halftone processing by respective multi-valued screens. Reference numeral 1101 indicates multi-valued signal levels processed by a screen used in the normal image forming mode. Reference numeral 1102 indicates multi-valued signal levels processed by a screen used in the wide color gamut image forming mode.

As a characteristic of a signal level of reference numeral 1101, the signal level is raised to the maximum signal level in relation to pixel to be printed, and then the next pixel is printed. As a result, stable image formation can be anticipated particularly in a low density portion where image formation is unstable. On the other hand, in the wide color gamut image forming mode, it is possible to increase the amount of toner adhering to a latent image portion. Therefore, image formation is stable when compared with the normal image forming mode. However, since there is an adverse effect due to a large amount of toner that adheres, the next pixel is printed without raising the signal level to the maximum signal level in the low density portion as illustrated by reference numeral 1102. As a result, it is possible to avoid adverse effects such as a tone jump and the screen texture being conspicuous which are generated due to an increase in the dot size. Note that the signal level may be raised to the maximum signal level at a stage where the number of print pixels has increased to some extent.

As described above, for a low screen ruling screen according to the present embodiment, a threshold matrix for printing the following pixels without raising the signal level to the maximum signal level is set in a low density portion when reproducing a wide color gamut image. In this manner, processing to change the amount of toner used at a time of image formation and enlarge a color reproduction range is executed by controlling the rotational speeds of the photosensitive drum 304 and the developing roller 303. At this time, by using a screen in which the signal level is not raised to the maximum signal level in halftone processing in the low density portion, it is possible to perform printing without impairing tone reproducibility.

<Variation>

In the embodiments described above, illustration was given for a case of executing halftoning processing using the threshold matrix on the image forming apparatus 100, but there is no limitation to this. For example, the present invention can also be applied to a case where a halftone image is formed by a host computer such as a PC and a print job including the halftone image is transmitted to the image forming apparatus 100. In this case, the processing illustrated in FIG. 10 is realized by a hardware processor of the host computer executing a printer driver program for the image forming apparatus 100 that is installed in the host computer. In this instance, the determination as to whether the image forming mode is the normal image forming mode or the wide color gamut image forming mode indicated in step S1001 may be performed based on the setting of the image forming mode for a time of printing that is stored in the printer driver.

According to the present invention, when the rotational speeds of the photosensitive drum and the developing roller are controlled to enlarge the color reproduction range, a tone correction can be suitably performed without impairing tone reproducibility.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s)

and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-151968 filed on Aug. 10, 2018, which is hereby incorporated by reference herein in its entirety.

What is claimed is:

1. An image forming apparatus, comprising:
   an exposure unit configured to expose a photosensitive drum to form an electrostatic latent image based on an image to which a dither matrix has been applied;
   a development unit configured to develop, using a developing material on a developing roller, the formed electrostatic latent image; and
   a controller including a processor and a memory, the controller configured to:
      receive a first print setting or a second print setting, wherein the first print setting requests a circumferential speed of the developing roller relative to a circumferential speed of the photosensitive drum that is higher than that which the second print setting requests; and
      in a case that the first print setting requesting the higher relative circumferential speed is received, control the developing roller and the photosensitive drum so that the circumferential speed of the developing roller relative to the circumferential speed of the photosensitive drum is higher and set the dither matrix to have a lower screen ruling compared with a case that the second print setting requesting the lower relative circumferential speed is received.

2. The image forming apparatus according to claim 1, wherein the controller is further configured to, based on a print setting change instruction by a user, control a maximum density to be formed by the exposure unit and the development unit to increase and decrease a screen ruling of the dither matrix.

3. The image forming apparatus according to claim 2, wherein the maximum density is defined as a density of an image formed onto a sheet when a density value of the image is a maximum value in a range that can be achieved.

4. The image forming apparatus according to claim 3, wherein the print setting change instruction is a single instruction by the user.

5. An image forming system, comprising:
   an exposure unit configured to expose a photosensitive drum to form an electrostatic latent image based on an image to which a dither matrix has been applied;
   a development unit configured to develop, using a developing material on a developing roller, the formed electrostatic latent image;
   a receiving unit configured to receive a first print setting or a second print setting, wherein the first print setting requests a circumferential speed of the developing roller relative to a circumferential speed of the photosensitive drum that is higher than that which the second print setting requests; and
   a controller including a processor and a memory, the controller configured to:
      in a case that the first print setting requesting the higher relative circumferential speed is received, control the developing roller and the photosensitive drum so that the circumferential speed of the developing roller relative to the circumferential speed of the photosensitive drum is higher and set the dither matrix to have a lower screen ruling compared with a case that the second print setting requesting the lower relative circumferential speed is received.

6. The image forming system according to claim 5, wherein the controller is further configured to, based on a print setting change instruction by a user, control a maximum density to be formed by the exposure unit and the development unit to increase and decrease a screen ruling of the dither matrix.

7. The image forming system according to claim 6, wherein the maximum density is defined as a density of an image formed onto a sheet when a density value of the image is a maximum value in a range that can be achieved.

8. The image forming system according to claim 7, wherein the print setting change instruction is a single instruction by a user.

* * * * *